(12) United States Patent
Bangsaruntip et al.

(10) Patent No.: US 9,343,142 B2
(45) Date of Patent: May 17, 2016

(54) NANOWIRE FLOATING GATE TRANSISTOR

(75) Inventors: Sarunya Bangsaruntip, Mount Kisco, NY (US); Guy Cohen, Mohegan Lake, NY (US); Amlan Majumdar, White Plains, NY (US); Jeffrey W. Sleight, Ridgefield, CT (US)

(73) Assignee: GlobalFoundries Inc., Ugland House (KY)

( * ) Notice: Subject to any disclaimer, the term of this patent is extended or adjusted under 35 U.S.C. 154(b) by 787 days.

(21) Appl. No.: 13/344,517

(22) Filed: Jan. 5, 2012

(65) Prior Publication Data

US 2013/0175597 A1    Jul. 11, 2013

(51) Int. Cl.
*H01L 29/66* (2006.01)
*H01L 29/788* (2006.01)
*G11C 11/56* (2006.01)
*H01L 21/28* (2006.01)
*H01L 29/423* (2006.01)
*H01L 29/06* (2006.01)

(52) U.S. Cl.
CPC ...... *G11C 11/5671* (2013.01); *H01L 21/28273* (2013.01); *H01L 29/0673* (2013.01); *H01L 29/42332* (2013.01); *H01L 29/42336* (2013.01); *H01L 29/66825* (2013.01); *H01L 29/7881* (2013.01)

(58) Field of Classification Search
CPC ............ H01L 27/115; H01L 27/11521; H01L 29/42324; H01L 29/66825; H01L 29/7883; H01L 27/105; H01L 27/11556; H01L 27/1211; H01L 29/785; H01L 27/11582; H01L 29/7926; H01L 21/28273; H01L 29/66833; H01L 29/792

USPC ............... 257/390, 208, 296, E21.507
See application file for complete search history.

(56) References Cited

U.S. PATENT DOCUMENTS

| | | | | |
|---|---|---|---|---|
| 5,274,602 A | * | 12/1993 | Glenn | 365/239 |
| 6,310,376 B1 | * | 10/2001 | Ueda et al. | 257/315 |
| 6,630,708 B1 | * | 10/2003 | Uchiyama | 257/316 |
| 6,653,174 B1 | * | 11/2003 | Cho et al. | 438/133 |
| 6,699,754 B2 | * | 3/2004 | Huang | 438/257 |
| 6,911,373 B2 | | 6/2005 | Kellar et al. | 438/399 |
| 7,148,547 B2 | * | 12/2006 | Rudeck | 257/390 |

(Continued)

FOREIGN PATENT DOCUMENTS

| CN | 101589461 A | 11/2009 | H01L 21/44 |
|---|---|---|---|
| CN | 102301482 A | 12/2011 | H01L 29/78 |

OTHER PUBLICATIONS

Combined Search and Examination Report for UK Patent Application No. GB1222356.6, pp. 1-5 (Apr. 12, 2013).

(Continued)

*Primary Examiner* — Mary Wilczewski
*Assistant Examiner* — Tsz Chiu
(74) *Attorney, Agent, or Firm* — Heslin Rothenberg Farley & Mesiti P.C.; George Blasiak

(57) ABSTRACT

A floating gate transistor, memory cell, and method of fabricating a device. The floating gate transistor includes one or more gated wires substantially cylindrical in form. The floating gate transistor includes a first gate dielectric layer at least partially covering the gated wires. The floating gate transistor further includes a plurality of gate crystals discontinuously arranged upon the first gate dielectric layer. The floating gate transistor also includes a second gate dielectric layer covering the plurality of gate crystals and the first gate dielectric layer.

20 Claims, 9 Drawing Sheets

(56) References Cited

U.S. PATENT DOCUMENTS

| | | | |
|---|---|---|---|
| 7,382,017 B2 | 6/2008 | Duan et al. | 257/321 |
| 7,498,211 B2 | 3/2009 | Ban et al. | 438/157 |
| 7,723,789 B2 | 5/2010 | Lin et al. | 257/349 |
| 7,755,141 B2 * | 7/2010 | Kasama et al. | 257/351 |
| 7,777,272 B2 | 8/2010 | Youn et al. | 257/324 |
| 7,884,004 B2 | 2/2011 | Bangsaruntip et al. | 438/586 |
| 2001/0043112 A1 * | 11/2001 | Voldman | 327/534 |
| 2003/0122183 A1 * | 7/2003 | Jang | 257/315 |
| 2006/0237800 A1 * | 10/2006 | Rudeck | 257/384 |
| 2007/0014151 A1 | 1/2007 | Zhang et al. | 365/185.01 |
| 2007/0111441 A1 * | 5/2007 | Koh et al. | 438/257 |
| 2008/0203477 A1 * | 8/2008 | Yamazaki et al. | 257/347 |
| 2009/0065852 A1 | 3/2009 | Lin et al. | 257/326 |
| 2010/0003795 A1 * | 1/2010 | Park et al. | 438/266 |
| 2010/0117138 A1 * | 5/2010 | Huerta et al. | 257/324 |
| 2010/0193770 A1 * | 8/2010 | Bangsaruntip et al. | 257/24 |
| 2011/0018053 A1 | 1/2011 | Lo | H01L 21/28 |
| 2011/0254069 A1 * | 10/2011 | Kim et al. | 257/315 |

OTHER PUBLICATIONS

J. Fu, et al., "Trap Layer Engineered Gate-All-Around Vertically Stacked Twin Si-Nanowire Nonvolatile Memory" IEEE, pp. 79-82 (2007).

Fu-Liang Yang, et al., "5nm Gate Nanowire FINFET" 2004 Symposium on VLSI Technology Digest of Technical Papers, pp. 196-197 (2004).

Donggun Park, "Silicon Nanowire CMOSFETs" IEEE, pp. 1-4 (2008).

PCT/EP2012/073660 International Search Report and Written Opinion dated Apr. 5, 2013.

J. Fu et al., "Si-Nanowire Based Gate-All-Around Nonvolatile SONOS Memory Cell," IEEE Electron Device Letters, vol. 29, No. 5, May 2008, pp. 518-521.

J. Fu et al., "Polycrystalline Si Nanowire SONOS Nonvolatile Memory Cell Fabricated on a Gate-All-Around (GAA) Channel Architecture," IEEE Electron Device Letters, vol. 30, No. 3, Mar. 2009, pp. 246-249.

J. Fu et al., "Integration of High-κ Dielectrics and Metal Gate on Gate-All-Around Si-Nanowire-Based Architecture for High-Speed Nonvolatile Charge-Trapping Memory." IEEE Electron Device Letters, vol. 30, No. 6, Jun. 2009, pp. 662-664.

S.-W. Ryu et al., "One-Transistor Nonvolatile SRAM (ONSRAM) on Silicon Nanowire SONOS," IEEE International Electron Devices Meeting (IEDM), Dec. 7-9, 2009, pp. 1-4.

S. D. Suk et al.,"Gate-all-around Twin Silicon nanowire SONOS Memory," IEEE Symposium VLSI Technology, Jun. 12-14, 2007, pp. 142-143.

X. Zhu et al., "Silicon Nanowire Nonvolatile-Memory with Varying HfO2 Charge Trapping Layer Thickness," International Semiconductor Device Research Symposium, ISDRS, 2009, pp. 1-2.

* cited by examiner

NANOWIRE FLOATING GATE TRANSISTOR

BACKGROUND

The present invention is directed towards transistors, and more particularly to transistors having a floating gate and memory devices utilizing floating gate transistors.

Since its popularization in the early 1950s, the transistor has led the electronic revolution. The transistor continues to be a focus for innovation in building smaller, faster, more energy efficient devices. Transistors are commonly used in processors, memory devices, and many other types of circuits. Memory devices generally involve the use of transistors to control the storage of data in components such as capacitors, phase change materials, or other materials. Memory devices have also been built utilizing the features of transistors to store data in the transistor.

BRIEF SUMMARY

An example embodiment of the present invention is a floating gate transistor. The floating gate transistor includes one or more gated wires substantially cylindrical in form. The floating gate transistor includes a first gate dielectric layer at least partially covering the gated wires. The floating gate transistor further includes a plurality of gate crystals discontinuously arranged upon the first gate dielectric layer. The floating gate transistor also includes a second gate dielectric layer covering the gate crystals and first gate dielectric layer.

Another example embodiment of the present invention is a method of fabricating a device. The method includes forming one or more gated wires substantially cylindrical in form. The method also includes forming a first gate dielectric layer at least partially covering the gated wires. The method further includes forming a plurality of gate crystals discontinuously arranged upon the first gate dielectric layer. The method also includes forming a second gate dielectric layer covering the gate crystals and first gate dielectric layer.

Yet another example embodiment of the invention is a method. The memory cell includes one or more gated wires substantially cylindrical in form. The memory cell also includes a first gate dielectric layer at least partially covering the gated wires. The memory cell further includes a plurality of gate crystals discontinuously arranged upon the first gate dielectric layer. The memory cell also includes a second gate dielectric layer covering the gate crystals and first gate dielectric layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-9B. As discussed in detail below, embodiments of the present invention include a floating gate transistor, memory cell, and method of fabricating a device.

Figure 1:
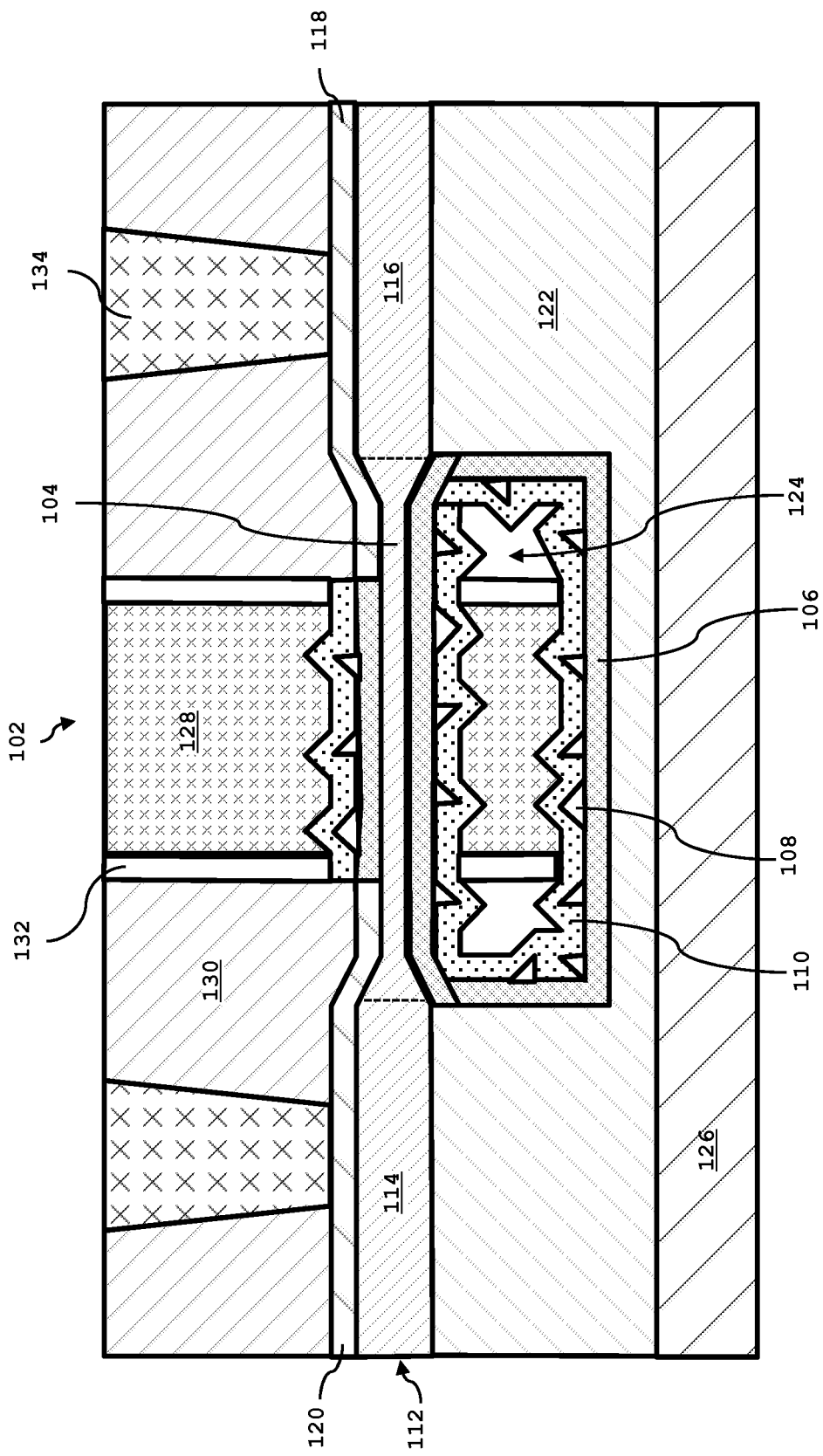
FIG. 1 shows a cross-section of an example embodiment of a floating gate transistor.

FIG. 1 shows a cross-section of an example embodiment of a floating gate transistor 102. In one embodiment the floating gate transistor 102 is a memory cell. The floating gate transistor 102 may include one or more gated wires 104 substantially cylindrical in form. In one embodiment, each of the gated wires 104 is less than 20 nanometers in diameter. With reference to FIG. 1, the diameter of the gated wires is measured on a cross-section of the gated wires 104 taken along a direction into the page. The floating gate transistor 102 may include a first gate dielectric layer 106 at least partially covering the gated wires 104.

The floating gate transistor 102 may include a plurality of gate crystals 108 discontinuously arranged upon the first gate dielectric layer 106. In one embodiment, the gate crystals 108 are electrically conductive. In another embodiment the gate crystals 108 are semiconductors. For example, the gate crystals 108 may be polysilicon. The gate crystals 108 may also be configured to store an electric charge in the absence of an applied electric field. In one embodiment, the floating gate transistor 102 includes a second gate dielectric layer 110 covering the gate crystals 108 and first gate dielectric layer 106.

The floating gate transistor 102 may include a semiconductor layer 112 carrying the gated wires 104. In one embodiment, the semiconductor layer 112 includes a source pad 114 and a drain pad 116. It is noted that the position of the source pad 114 may be interchangeable with the position of the drain pad 116. Thus, in some embodiments, the positions of the source pad 114 and the drain pad 116 are reversed according to those shown in FIG. 1. The gated wires 104 may be fabricated between the source pad 114 and drain pad 116. It is also noted that several of the figures herein show dashed lines separating the source pad 114 and the drain pad 116 from the gated wires 104. These dashed lines do not indicate separate layers but rather clarify the distinct parts of one common layer, i.e., the semiconductor layer 112. The floating gate transistor 102 may include a drain silicide layer 118 above the drain pad 116 and a source silicide layer 120 above the source pad 114.

The floating gate transistor 102 may include an insulator layer 122 below the semiconductor layer 112. The insulator layer 122 may have a recessed region 124 below the gated wires 104. In one embodiment, the recessed region 124 is covered by the first gate dielectric layer 106. The floating gate transistor 102 may include a substrate 126 below the insulator layer 122. The floating gate transistor 102 may include a gate conductor layer 128 electrically coupled to the second gate dielectric layer 110. The floating gate transistor 102 may include a planarized dielectric layer 130 and one or more gate sidewall spacers 132 positioned between the planarized dielectric layer 130 and the gate conductor layer 128. The floating gate transistor 102 may include contact vias 134 configured to electrically connect the source silicide layer 120 and the drain silicide layer 118 to an external circuit. The floating gate memory cell is explained in detail in FIGS. 3-20 and their accompanying description.

Figure 2:
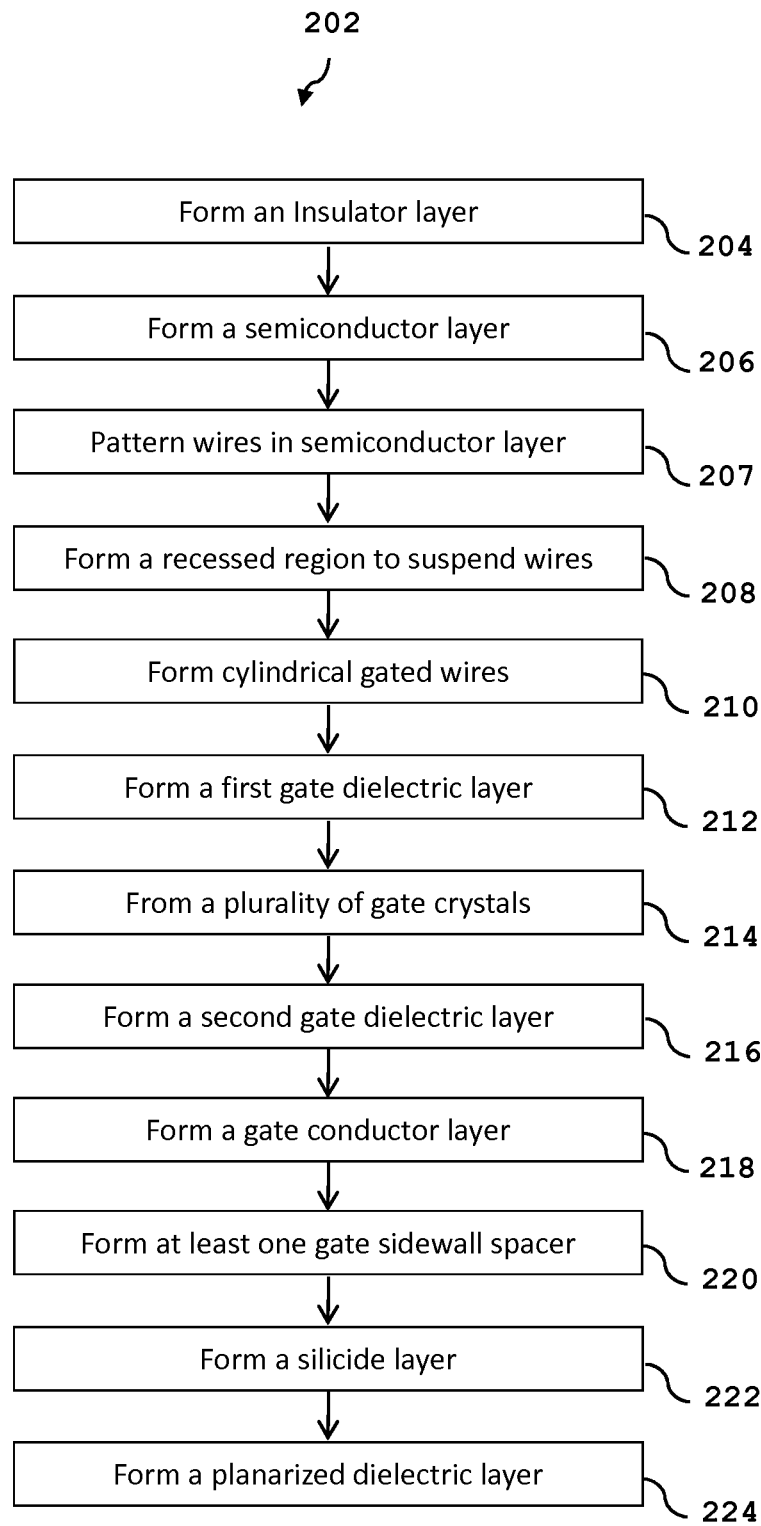
FIG. 2 shows an example embodiment of a method 202 of fabricating a device.

FIG. 2 shows an example embodiment of a method 202 of fabricating a device. In one embodiment, the method 202 includes an insulator layer forming step 204 of forming an insulator layer. The insulator layer may be formed on a substrate layer. In one embodiment, the method 202 includes a semiconductor layer forming step 206 of forming a semiconductor layer above the insulator layer. In one embodiment, the semiconductor layer forming step 206 includes forming a source pad and a drain pad. In one embodiment of method 202, the insulator layer forming step 204 is not performed prior to the semiconductor layer forming step 206, but rather the semiconductor layer forming step 206 includes forming the source pad and drain pad in a semiconductor layer of a pre-fabricated semiconductor on insulator wafer. In one embodiment, the method includes a wire patterning step 207 of patterning one or more nanowires in the semiconductor layer between the source pad and drain pad. The method 202 may include a recessed region forming step 208 of forming a recessed region in the insulator layer to suspend the nanowires.

The method 202 may include a gated wire forming step 210 of forming one or more gated wires substantially cylindrical in form. In one embodiment, the at least one gated wire is less than 20 nanometers in diameter. The gated wire may be formed in a part of the semiconductor layer, for example, from the nanowires. The gated wires may be formed above the recessed region. The gated wires may be fabricated between the source pad and drain pad.

The method 202 may include a first gate dielectric layer forming step 212 of forming a first gate dielectric layer at least partially covering the gated wires. In one embodiment, the first gate dielectric layer forming step 212 includes covering the recessed region by the first gate dielectric layer.

The method 202 may include a gate crystals forming step 214 of forming a plurality of gate crystals discontinuously arranged upon the first gate dielectric layer. In one embodiment, the gate crystals are electrically non-insulating. The gate crystals may be configured to store an electric charge in the absence of an applied electric field. For example, the gate crystal may be polysilicon. The method may include a second gate dielectric layer forming step 216 of forming a second gate dielectric layer covering the gate crystals and first gate dielectric layer.

In one embodiment, the method 202 includes a gate conductor layer forming step 218 of forming a gate conductor layer electrically coupled to the second gate dielectric layer. The method 202 may include a gate sidewall forming step 220 of forming one or more gate sidewall spacers positioned between the planarized dielectric layer and the gate conductor layer. It is noted that in some embodiments, the planarized dielectric layer is formed after the gate sidewall spacers. In such case, the gate sidewall spacers may be positioned so that when the planarized dielectric layer is formed, the gate sidewall spacers are between the planarized dielectric layer and the gate conductor layer.

In one embodiment, the method 202 includes a silicide layer forming step 222 of forming a drain silicide layer above the drain pad and forming a source silicide layer above the source pad. The method 202 may include a planarizing step 224 of forming a planarized dielectric layer. Method 202 and all of its steps are explained in detail through FIGS. 3-20 and their accompanying description.

Figure 3A:
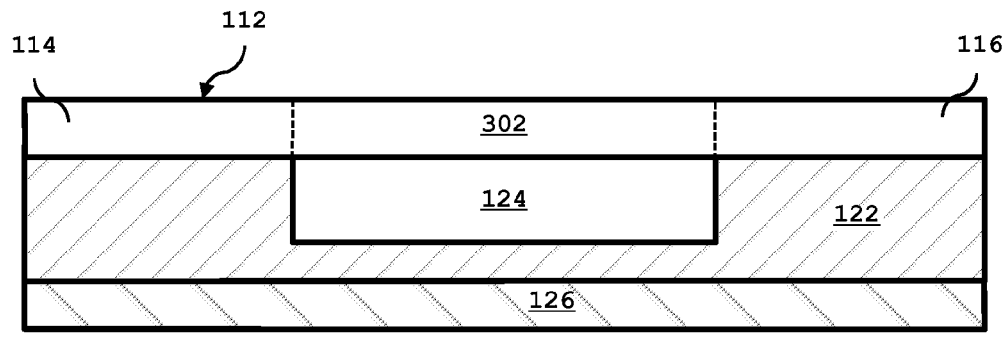
FIG. 3A shows the formation of nanowires, a source pad, and a drain pad in a semiconductor layer in accordance with an embodiment of the present invention.
Figure 3B:
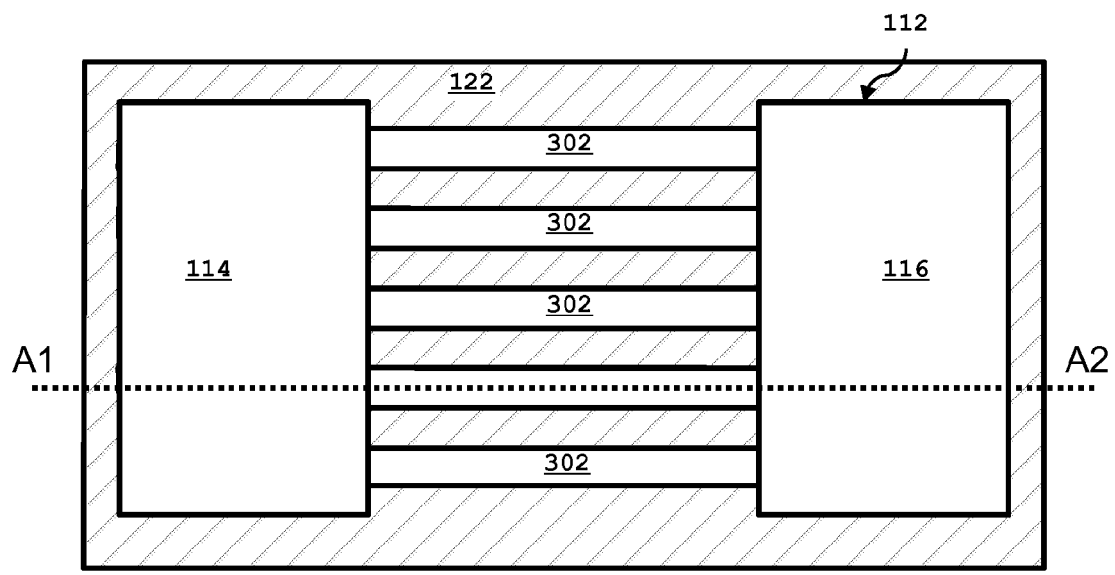
FIG. 3B shows a top view of FIG. 3A.

FIGS. 3A and 3B shows the formation of nanowires 302, a source pad 114, and a drain pad 116 in a semiconductor layer 112. FIG. 3A shows a cross-section along the A1-A2 line shown in FIG. 3B, and FIG. 3B shows a top down view of the nanowires 302, source pad 114, and drain pad 116. The semiconductor layer 112 may be formed above an insulator layer 122. The insulator layer 122 may be formed above a substrate 126. In one embodiment, the nanowires 302 have a rectangular cross-section. The nanowires 302 may connect the source pad 114 to the drain pad 116. The number of nanowires 302 may depend on the design requirements of the device. For example, a typical number of rectangular nanowires 302 could be fifteen, but some embodiments may include only one nanowire 302.

In one embodiment, the nanowires 302, source pad 114, and drain pad 116 are formed from a prefabricated semiconductor on insulator wafer. For example, a silicon-on-insulator (SOI) substrate that includes a silicon wafer as a substrate 126, a buried oxide as an insulator layer 122, and a silicon layer as a semiconductor layer 112 can be used as the starting wafer for the fabrication of the device. In one embodiment, the nanowires 302 are patterned in the semiconductor layer 112, and then, the insulator layer 122 is recessed below the nanowires 302, leaving a recessed region 124. The recessed region 124 in the insulator layer 122 may be formed by a wet etch using, for example, diluted hydrofluoric acid.

Figure 4A:
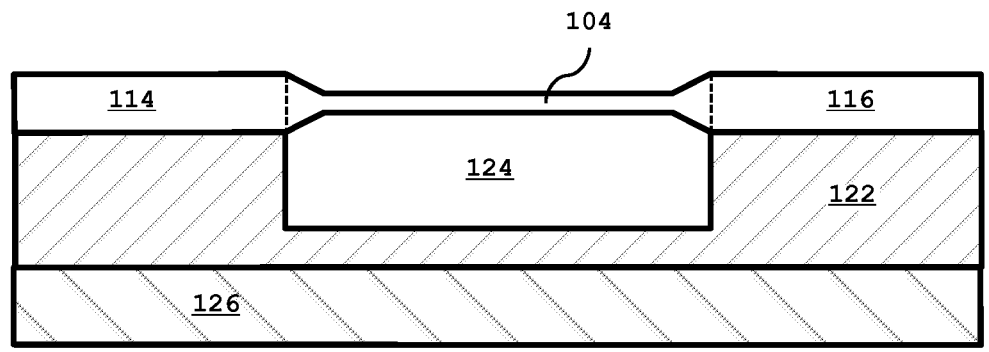
FIG. 4A shows the formation of one or more gated wires in accordance with embodiments of the present invention.
Figure 4B:
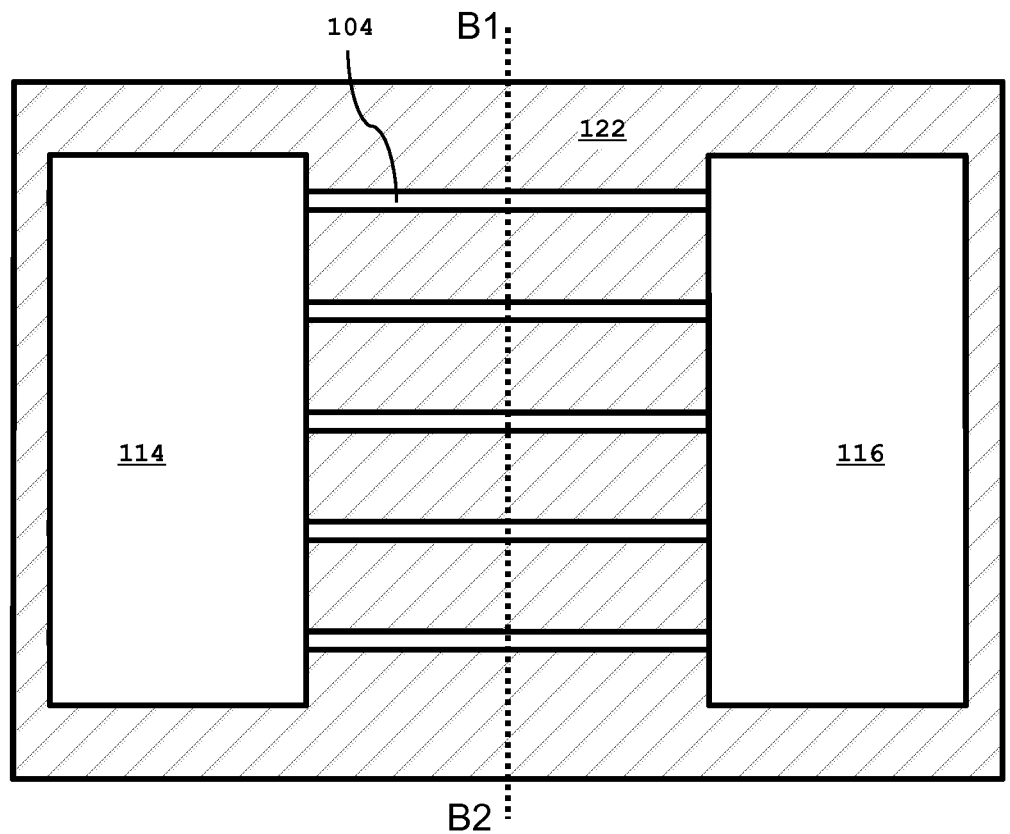
FIG. 4B shows a top view of FIG. 4A.

FIGS. 4A-B show the formation of one or more gated wires 104. FIG. 4A shows a cross-section along the A1-A2 line shown in FIG. 3B after formation of gated wires 104. FIG. 4B shows a top-down view of the gated wires 104. The gated wires 104 may be formed from an annealing process. In one embodiment, the gated wires 104 are formed by annealing the nanowires 302 in hydrogen at a temperature of around 850 degrees C. for roughly ten minutes. A hydrogen annealing process that is typically used is described in U.S. Pat. No. 7,884,004 issued Feb. 8, 2011, incorporated herein by reference in its entirety. In one embodiment, the surface of the nanowires 302 is cleaned before the annealing process. The annealing process may be configured to cause silicon or other element in the nanowires to redistribute such that the nanowires are thinned and formed into a cylindrical shape.

In one embodiment, the gated wires 104 each have a round or elliptical cross-section perpendicular to the length of the gated wire 104. For example, depending on the aspect ratio of the cross-section of the nanowire 302 from which a gated wire 104 is formed, the gated wire 104 cross-section may be a circle or an ellipse. In one embodiment, the gated wires 104 are less than 20 nanometers in diameter. The diameter of the gated wires 104 may depend on the design objectives of the finished device, and thus may be greater or smaller than 20 nanometers in some embodiments. For example, some devices may have a gated wire 104 diameter between 5 and 10 nanometers.

Figure 5A:
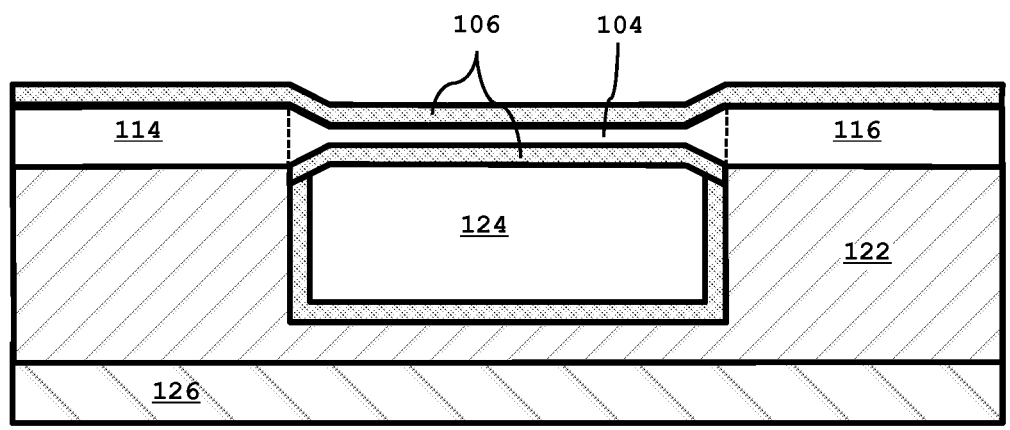
FIG. 5A shows the formation of a first gate dielectric layer at least partially covering the one or more gated wires along the A1-A2 line shown in FIG. 3B.
Figure 5B:
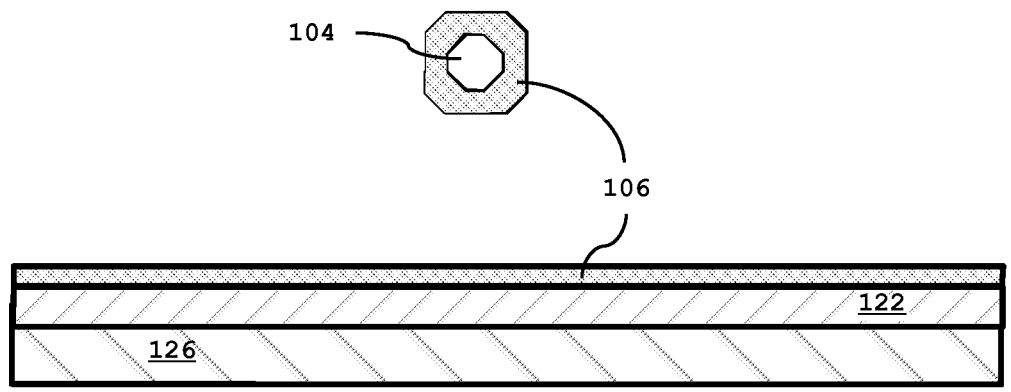
FIG. 5B shows a cross section of FIG. 5A.

FIGS. 5A and 5B show the formation of a first gate dielectric layer 106 at least partially covering the gated wires 104.

FIG. 5A shows a cross-section along the A1-A2 line shown in FIG. 3B after formation of a first gate dielectric layer 106. FIG. 5B shows a cross-section along the B1-B2 line in FIG. 4B after formation of a first gate dielectric layer 106. In one embodiment, the first gate dielectric layer 106 is a thin layer of silicon dioxide coated with a material having a high dielectric constant such as hafnium oxide. The first gate dielectric layer 106 may be formed by a conformal deposition technique. In one embodiment, the conformal deposition technique includes growing a thermal oxide. In another embodiment, the conformal deposition technique includes an atomic layer deposition. The first gate dielectric layer 106 may be formed on the exposed surfaces of the gated wires 104. In one embodiment, the first gate dielectric layer 106 is formed on the exposed surface of the insulator layer 122 in the recessed region 124 and the exposed surface of the semiconductor layer 112.

Figure 6A:
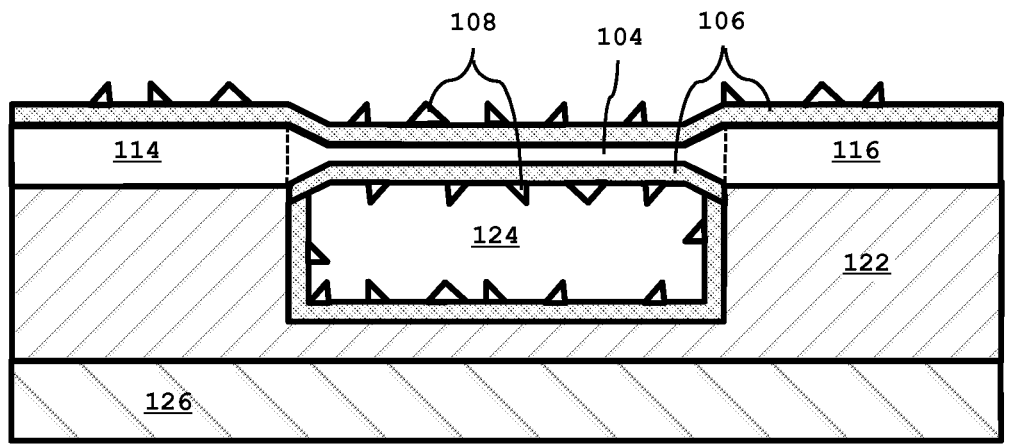
FIG. 6A shows the formation a plurality of gate crystals on the exposed surfaces of the first gate dielectric layer along the A1-A2 line shown in FIG. 3B.
Figure 6B:
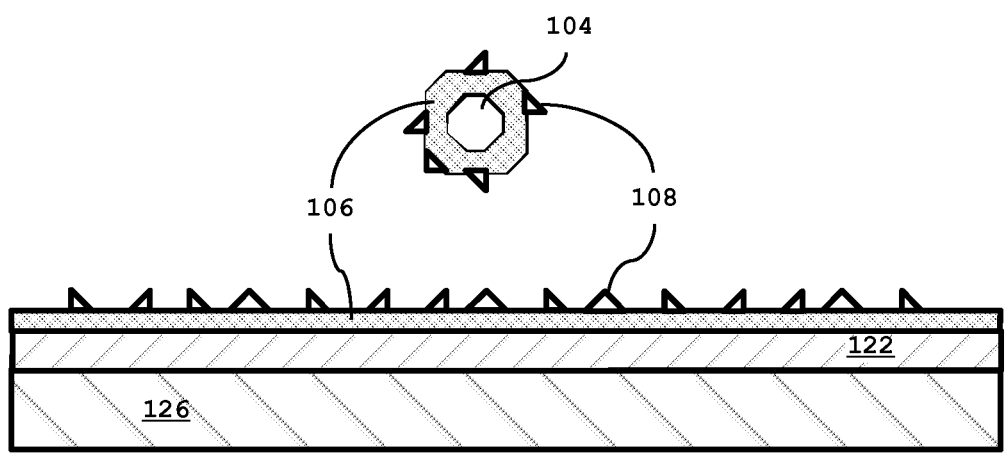
FIG. 6B shows a cross section of FIG. 6A.

FIGS. 6A and 6B show the formation a plurality of gate crystals 108 on the exposed surfaces of the first gate dielectric layer 106. FIG. 6A shows a cross-section along the A1-A2 line shown in FIG. 3B after formation of the gate crystals 108. FIG. 6B shows a cross-section along the B1-B2 line shown in FIG. 4B after formation of the gate crystals 108. In one embodiment, the gate crystals 108 are discontinuously arranged upon the first gate dielectric layer 106. The gate crystals 108 may be close together but generally not touching other gate crystals 108. The spacing between the gate crystals may be determined by the design requirements of the device. In one embodiment, the gate crystal spacing is generally less than 10 nanometers, and more typically about 2 to 5 nm.

The gate crystals 108 may be made of polysilicon or germanium crystallites. The gate crystals 108 may be made of other conductive or semiconductor materials. The gate crystals 108 may be formed by a chemical vapor deposition technique. Alternatively, the gate crystals 108 may be formed by first forming a colloid and spraying the colloid on to the first gate dielectric layer 106. The gate crystals 108 may be crystallites in the range of a few nanometers in size. In one embodiment, the gate crystals 108 are each substantially pyramid-shaped. In another embodiment, the gate crystals 108 are each substantially dome-shaped. The exact shape may depend on the material that is used to form the gate crystals 108.

Figure 7A:
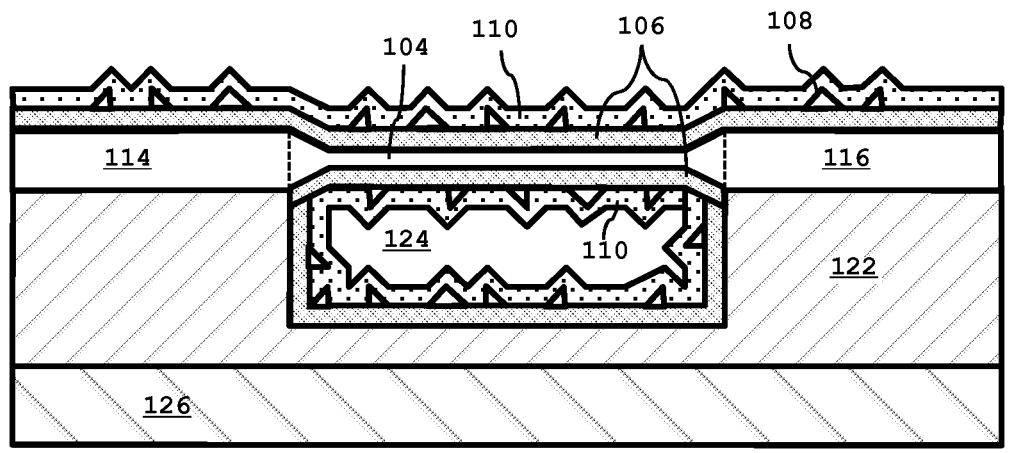
FIG. 7A shows the formation of a second gate dielectric layer in accordance with embodiments of the present invention.
Figure 7B:
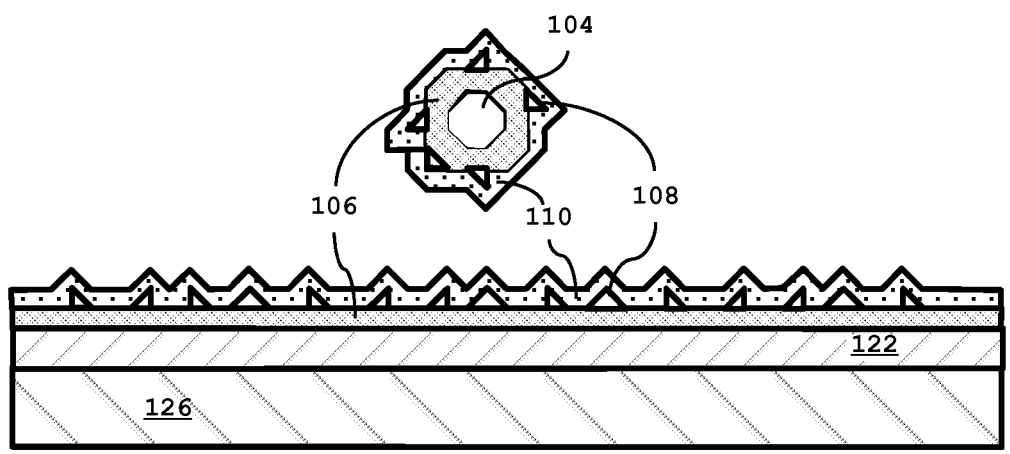
FIG. 7B shows a cross section of FIG. 7A.

FIGS. 7A and 7B show the formation of a second gate dielectric layer 110. FIG. 7A shows a cross-section along the A1-A2 line shown in FIG. 3B after formation of the second gate dielectric layer 110. FIG. 7B shows a cross-section along the B1-B2 line shown in FIG. 4B after formation of the second gate dielectric layer 110. The second gate dielectric layer 110 may cover the gate crystals 108 and first gate dielectric layer 106. In one embodiment, the second gate dielectric layer 110 is formed by a suitable conformal deposition technique such as atomic layer deposition. As such, the second gate dielectric layer 110 may conform to the gate crystals 108 and the first gate dielectric layer.

Figure 8A:
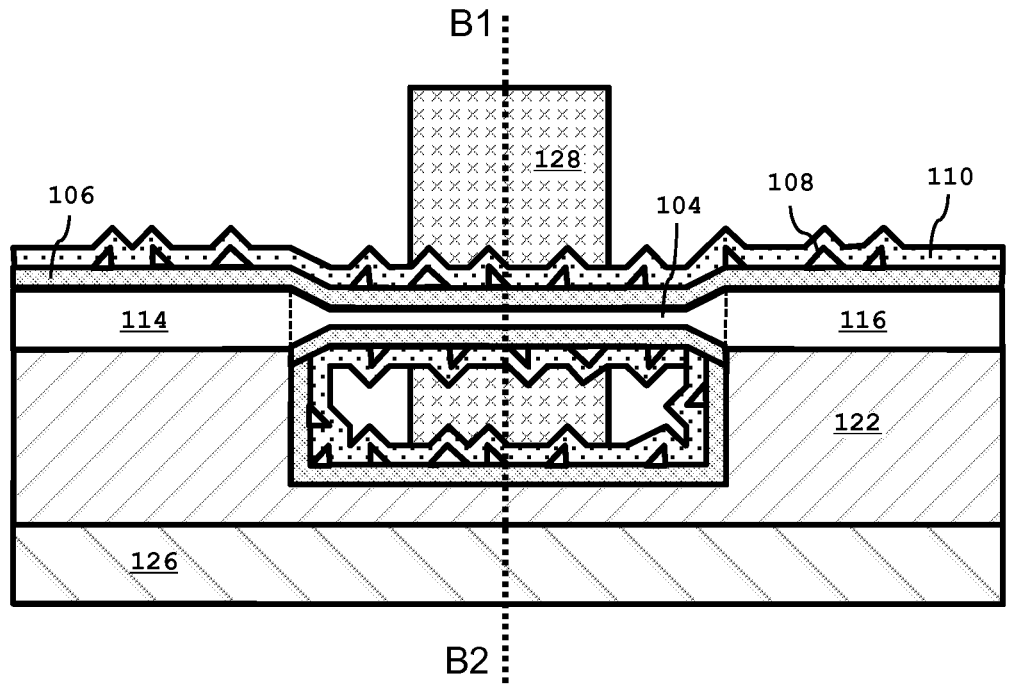
FIG. 8A shows the formation of a gate conductor layer in accordance with embodiments of the present invention.
Figure 8B:
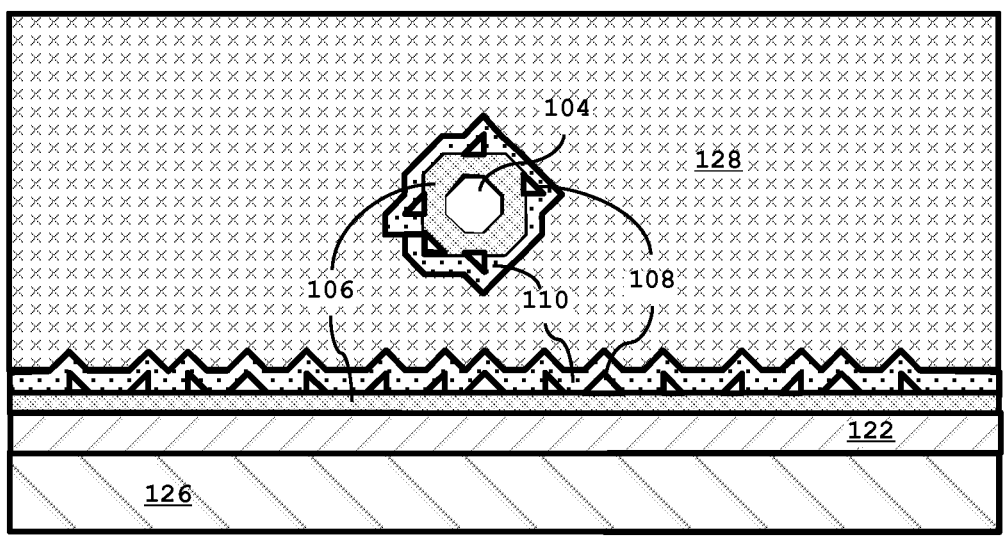
FIG. 8B shows a cross section of FIG. 8A.

FIGS. 8A and 8B show the formation of a gate conductor layer 128. FIG. 8A shows a cross-section along the A1-A2 line shown in FIG. 3B after the formation of the gate conductor layer 128. FIG. 8B shows a cross-section along the B1-B2 line shown in FIG. 8A. In one embodiment, the gate conductor layer 128 is electrically coupled to the second gate dielectric layer 110. For example, the gate conductor layer 128 may be made of a conductive material and may contact the second gate dielectric layer 128. The gate conductor layer 128 may enclose the second gate dielectric layer 110 for a least a part of the length of the gated wires 104. Typically, the gate conductor layer 128 will form a gate-all-around structure that controls the state of the floating gate transistor or memory device. Depending on the applied gate voltage, the gate crystals 108 can be loaded with charge, or depleted from charge. The loading of the gate crystals 108 with charge changes the threshold voltage of the device, and thus the device can have two states ("0" and "1"). Since the gate crystals 108 are electrically isolated the charge in the gate crystals 108 is typically maintained for years.

Figure 9A:
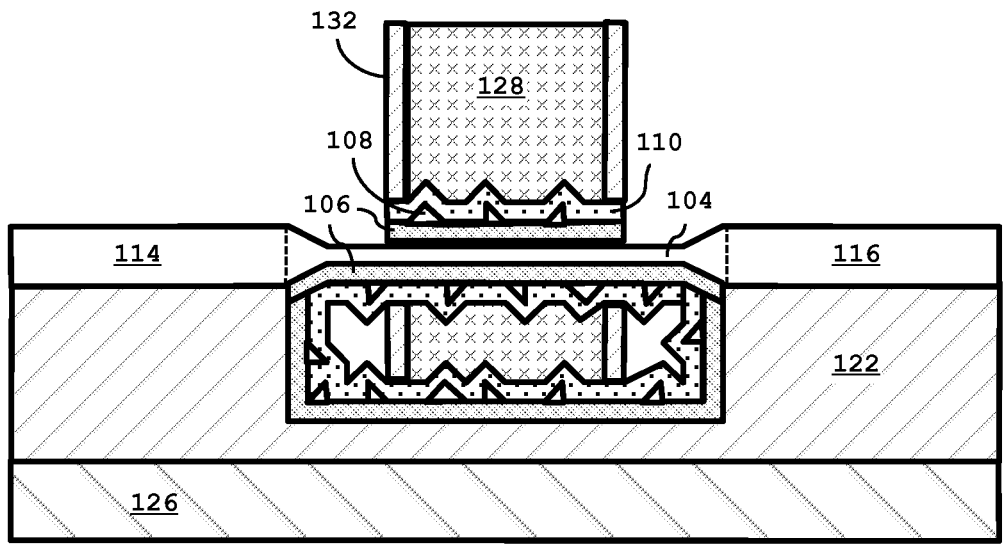
FIG. 9A shows the formation of one or more gate sidewall spacers in accordance with embodiments of the present invention.
Figure 9B:
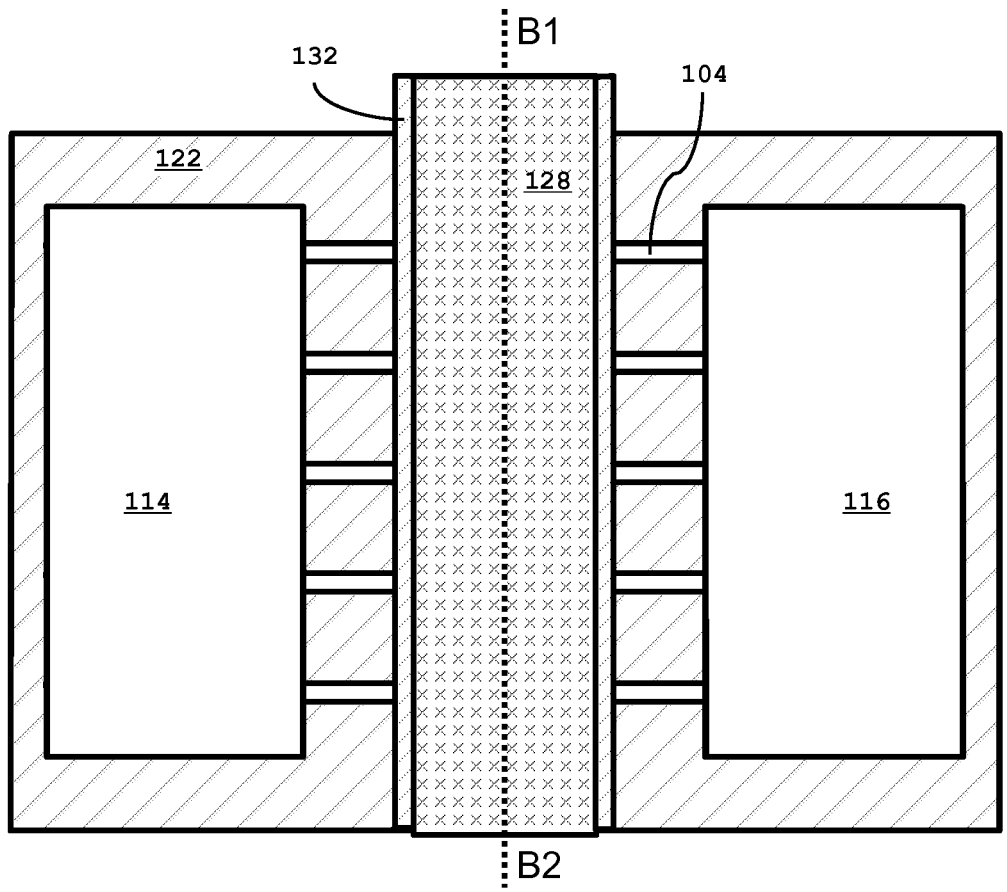
FIG. 9B shows a top view of FIG. 9A.

FIGS. 9A and 9B show the formation of one or more gate sidewall spacers 132. FIG. 9A shows a cross-section along the A1-A2 line shown in FIG. 3B after the formation of the gate sidewall spacers 132. FIG. 9B shows a top-down view. The gate sidewall spacers 132 may be formed along the side of the gate conductor layer 128. For example, the sidewall spacers 132 may be formed of silicon nitride. In one embodiment, portions of the first gate dielectric layer 106, plurality of gate crystals 108, and second gate dielectric layer 110 are removed to reveal the source pad 114 and the drain pad 116. In one embodiment, portions of the gated wires 104 may also be revealed close to the source pad 114 and drain pad 116.

Referring back to FIG. 1, the formation of an embodiment of the floating gate transistor and/or memory cell is shown. In sequence following FIGS. 9A and 9B, FIG. 1 shows the formation of a source silicide layer 120, a drain silicide layer 118, a planarized dielectric layer 130, and via contacts 134. FIG. 1 shows a cross-section along the A1-A2 line in FIG. 3B. The source silicide layer 120 and drain silicide layer 118 may be formed of nickel silicide (NiSi), but other silicide forming metals such as Pt, Ti, and Co may be used. In one embodiment, the source silicide layer 120 and drain silicide layer 118 are formed by depositing a layer of nickel above the source pad 114 and drain pad 116, reacting the nickel with the silicon in the source pad 114 and drain pad 116, and removing the excess nickel to reveal the source silicide layer 120 and drain silicide layer 118.

After the source silicide layer 120 and drain silicide layer 118 are formed, a planarized dielectric layer 130 may be formed above the source silicide layer 120 and drain silicide layer 118. In one embodiment, the top of the planarized dielectric layer 130 is planarized with the top of the gate sidewall spacers 132 and conductive gate layer 128. Additionally, contact vias 134 may be formed in the planarized layer dielectric layer 130. In one embodiment, the contact vias 134 are configured to electrically connect the source silicide layer 120 and drain silicide layer 118 to an external circuit.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A floating gate transistor comprising:
   at least one gated wire substantially cylindrical in form;
   a first gate dielectric layer at least partially covering the at least one gated wire;
   a plurality of gate crystals discontinuously arranged upon the first gate dielectric layer; and
   a second gate dielectric layer covering the plurality of gate crystals and the first gate dielectric layer;
   wherein the gate crystals of the plurality of gate crystals are physically separate from each other, wherein the first gate dielectric surrounds the second gate dielectric and the gate crystals are positioned between the first gate dielectric layer and the second gate dielectric layer.

2. The floating gate transistor of claim 1, wherein the plurality of gate crystals are electrically non-insulating.

3. The floating gate transistor of claim 1, wherein the plurality of gate crystals is polysilicon.

4. The floating gate transistor of claim 1, wherein the plurality of gate crystals is configured to store an electric charge in the absence of an applied electric field.

5. The floating gate transistor of claim 1, further comprising:
a semiconductor layer carrying the at least one gated wire; and
an insulator layer below the semiconductor layer, the insulator layer having a recessed region below the at least one gated wire.

6. The floating gate transistor of claim 5, wherein the recessed region is covered by the first gate dielectric layer.

7. The floating gate transistor of claim 5, further comprising:
wherein the semiconductor layer includes a source pad and a drain pad; and
wherein the at least one gated wire is fabricated between the source pad and drain pad.

8. The floating gate transistor of claim 7, further comprising:
a drain silicide layer above the drain pad; and
a source silicide layer above the source pad.

9. The floating gate transistor of claim 1, further comprising:
a gate conductor layer electrically coupled to the second gate dielectric layer.

10. The floating gate transistor of claim 9, further comprising:
a planarized dielectric layer; and
at least one gate sidewall spacer positioned between the planarized dielectric layer and the gate conductor layer.

11. The floating gate transistor of claim 1, wherein the at least one gated wire is less than 20 nanometers in diameter.

12. The floating gate transistor of claim 1, wherein the first gate dielectric layer is in physical contact with the at least one gated wire.

13. The floating gate transistor of claim 1, wherein the gate crystals are positioned radially about the gated wire.

14. A memory cell comprising: at least one gated wire substantially cylindrical in form;
a first gate dielectric layer in physical contact with the at least one gated wire and at least partially covering the at least one gated wire;
a plurality of gate crystals discontinuously arranged upon the first gate dielectric layer; and
a second gate dielectric layer covering the plurality of gate crystals and first gate dielectric layer; and
wherein the first gate dielectric layer surrounds the second gate dielectric layer and the gate crystals are positioned between the first gate dielectric layer and the second gate dielectric layer.

15. The memory cell of claim 14, wherein the plurality of gate crystals is configured to store an electric charge in the absence of an applied electric field.

16. The memory cell of claim 14, further comprising:
a semiconductor layer carrying the at least one gated wire; and
an insulator layer below the semiconductor layer, the insulator layer having a recessed region below the at least one gated wire, wherein the recessed region is covered by the first gate dielectric layer; and
a gate conductor layer enclosing the second gate dielectric layer.

17. The memory cell of claim 14, wherein each of the at least one gated wire is less than 20 nanometers in diameter.

18. The memory cell of claim 14, wherein gate crystals of the plurality of gate crystals are physically separate from each other.

19. The memory cell of claim 14, wherein the gate crystals are positioned radially about the gated wire.

20. A floating gate transistor comprising:
at least one gated wire substantially cylindrical in form;
a first gate dielectric layer at least partially covering the at least one gated wire;
a plurality of gate crystals discontinuously arranged upon the first gate dielectric layer; and
a second gate dielectric layer covering the plurality of gate crystals and the first gate dielectric layer such that the plurality of gate crystals are positioned between and in physical contact with the first gate dielectric layer and the second gate dielectric layer;
wherein the gate crystals of the plurality of gate crystals are physically separate from each other; and
wherein the first gate dielectric layer surrounds the second gate dielectric layer and the gate crystals are positioned between the first gate dielectric layer and the second gate dielectric layer.

* * * * *